United States Patent [19]
Lienhard et al.

[11] Patent Number: 4,464,625
[45] Date of Patent: Aug. 7, 1984

[54] MAGNETORESISTIVE CURRENT DETECTOR

[75] Inventors: Heinz Lienhard, Zug; Jan Petr, Oberwil; Benedikt Steinle, Zug, all of Switzerland

[73] Assignee: LGZ Landis & Gyr Zug AG., Zug, Switzerland

[21] Appl. No.: 331,981

[22] Filed: Dec. 18, 1981

[30] Foreign Application Priority Data

Dec. 24, 1980 [CH] Switzerland .................. 9567/80

[51] Int. Cl.$^3$ ............... G01R 33/00; G01R 33/02
[52] U.S. Cl. ........................ 324/117 R; 323/294; 323/368; 324/252
[58] Field of Search ............ 324/117 R, 117 H, 252; 338/32 H; 323/368, 294; 364/846

[56] References Cited

U.S. PATENT DOCUMENTS

| | | | |
|---|---|---|---|
| 3,546,579 | 12/1970 | Paul et al. | 324/46 |
| 3,555,310 | 1/1971 | Haeusler | 307/309 |
| 3,649,912 | 3/1972 | Nakamura | 324/117 R |
| 3,820,089 | 6/1974 | Lama | 340/174 EB |
| 4,385,273 | 5/1983 | Lienhard et al. | 324/117 R |

FOREIGN PATENT DOCUMENTS 598000 3/1978 U.S.S.R. .................. 324/252

OTHER PUBLICATIONS

"Magnetoresistive Current Sensor", by C. H. Bajorek et al., in *IBM Tech. Disc. Bull.*, vol. 18, No. 8, Jan. 1976, pp. 2745-2748.

"Self-Biased Magnetoresistive Bridge Configuration for Current Measurement", by Feng, in *IBM Tech. Disc. Bull.*, vol. 18, No. 11, Apr. 1976, pp. 3847-3851.

"A Permalloy Current Sensor", by C. H. Bajorek, et al., in *IEEE Transactions on Magnetics*, vol. MAG-12, No. 6, Nov. 1976, pp. 813-815.

Primary Examiner—Stewart J. Levy
Attorney, Agent, or Firm—Ernest F. Marmorek

[57] ABSTRACT

In a magnetoresistive current detector, which includes a conductor carrying a current to be measured, which in turn generates an external magnetic field, four bridge elements are connected to one another so as to constitute a Wheatstone bridge. The Wheatstone bridge is adapted to be fed by a supply current from a current- or voltage-source and includes two pairs of ferromagnetic and magnetoresistive thin films which have hard and easy axes, respectively, and each thin film constitutes a respective bridge element. The thin films of each pair are magnetostatically coupled to one another, so that the portion of the supply current flowing in each thin film of each pair generates an auxiliary magnetic field, which has a direction along the hard magnetic axis of the other thin film of the same pair. The thin films of each pair form bridge portions connected to one another at respective bridge output terminals and all these films have substantially equal respective thicknesses; the external magnetic field has a direction along the direction of the hard magnetic axes of each of the thin films.

7 Claims, 6 Drawing Figures

MAGNETORESISTIVE CURRENT DETECTOR

CROSS-REFERENCE TO COPENDING APPLICATIONS

Reference should also be made to copending application Ser. No. 188,339, filed on Sept. 18, 1980, U.S. Pat. No. 4,385,273, entitled "Transducer for Measuring a Current Generated Magnetic Field" and copending applications entitled "Compensated Transducer" and "System for Measuring Electrical Output or Energy", filed concurrently, in which one of the applicants of the present application is a co-inventor, and which are assigned to the same assignee as the present invention.

BACKGROUND OF THE INVENTION

From U.S. Pat. No. 3,820,089 there is known a magnetoresistive bridge for detection of magnetic bubbles. In the above-noted bridge, all four magnetic films are disposed in a common plane, but no coupling exists between the magnetic films.

From U.S. Pat. No. 3,546,579 there is known a magnetometer including thin films, in which the thin films are magnetized along the direction of the easy magnetic axes. The magnetic films are free from any coupling between each other.

In U.S. Pat. No. 3,649,912, there is described a so-called compensated measurement transducer, in which magnetoresistive semi-conductor diodes are disposed in an air gap of the magnetic core. The circuit for the reduction of the inverse effect of Hall generators is known from U.S. Pat. No. 3,555,310.

From the IEEE action on magnetics, November 1976, pages 813 to 815, there is known a magnetoresistive current detector, including a conductor which carries a current to be measured generating an external field, four bridge elements connected to one another so as to constitute a Wheatstone bridge, and wherein the Wheatstone bridge is adapted to be fed by a supply current from a current- or voltage-source and includes two pairs of ferromagnetic and magnetoresistive thin films having hard and easy axes, respectively, and wherein the external magnetic field has a direction along the direction of the hard magnetic axis of each of the thin films, and the thin films of each pair are magnetostatically coupled to one another, so that the portion of the supply current flowing in each thin film of each pair generates an auxiliary magnetic field having a direction along the hard magnetic axes or the other thin film of the same pair. The thin films of each pair have, however, different respective thickness, so that the resistances of the thin films varying in respective opposite directions do not mutually cancel each other, thus providing a sufficiently large output signal.

SUMMARY OF THE INVENTION

It is accordingly an object of the present invention to improve a current detector of the aforedescribed kind so that it is simple in construction and has an improved linearity.

This object is attained in a magnetoresistive current detector, including a conductor carrying a current to be measured generating an external field, four bridge elements connected to one another so as to constitute a Wheatstone bridge, the Wheatstone bridge being adapted to be fed by a supply current from a current- or voltage-source, which comprises in combination two pairs of ferromagnetic and magnetoresistive thin films having hard and easy axes, respectively, wherein each thin film constitutes a respective of the bridge elements, and the thin films of each pair are magnetostatically coupled to one another, so that the portion of the supply current flowing in each thin film of each pair generates an auxiliary magnetic field having a direction along the hard magnetic axis of the other thin film of the same pair and where the thin films of each pair form bridge portions connected to one another at respective bridge output terminals, and all films have substantially equal respective thicknesses, the external magnetic field having a direction along the direction of the hard magnetic axis of each of the thin films.

Further objects and advantages of the invention will be set forth in part in the following specification, and in part will be obvious therefrom without being specifically referred to, the same being realized and attained as pointed out in the claims hereof.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENTS

Figure 1:
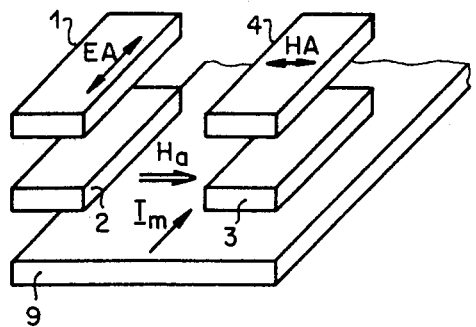
FIG. 1 is a fragmentary perspective view of the current detector of the present invention.

Referring now to the drawings, in FIG. 1, which is not drawn to scale, there will be seen four thin films of ferromagnetic magnetoresistive material. The thin films 1 and 4 are disposed in a first common plane, and thin films 2 and 3 are disposed in a second plane parallel to the first plane. The thin film 1 is superimposed on the thin film 2, and the thin film 4 is superimposed on the thin film 3. The thin films 1 and 2, as well as the thin films 4 and 3, have equal respective thicknesses, and each form a thin film pair, namely they are magnetostatically coupled to one another, spaced at a very small distance from one another, and insulated by a (non-illustrated) layer from one another.

Figure 2:
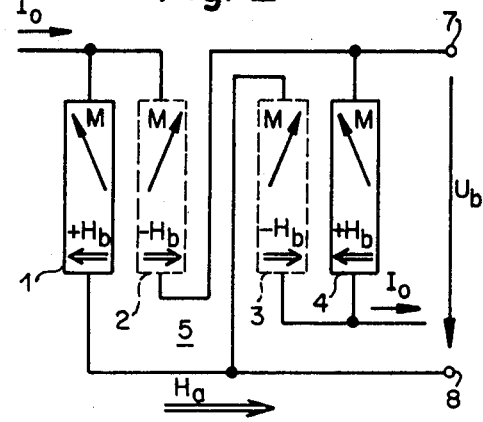
FIG. 2 is a circuit of the Wheatstone bridge used in the current detector, according to the present invention.

As can be seen from FIG. 2, there are formed bridge elements of an electrical Wheatstone bridge 5, in which each of the four bridge elements is constituted by a single thin film, so that the thin films 1 and 2 form one bridge portion, and the thin films 3 and 4 form another bridge portion connected to one another at respective bridge output terminals 7 and 8. The thin films 2 and 3 are shown dotted in FIG. 2, so as to indicate that they are disposed below respective thin films 1 and 4. The topmost ends of the thin films 1 and 2, and the lowermost ends of the thin films 3 and 4 are connected to a current- or voltage-source 6, shown in FIG. 3, which feeds a current $I_o$ into the Wheatstone bridge 5. The lowermost end of the thin film 2, as well as the topmost end of the thin film 4 are connected to an output terminal 7, and the lowermost end of the thin film 1 as well as the topmost end of the thin film 3 are connected to an output terminal 8 of the Wheatstone bridge 5.

The Wheatstone bridge 5 is subjected to an external magnetic field $H_a$. This field $H_a$ is generated by a current $I_m$ to be measured, which is carried by a conductor 9 and flows along the direction of the easy magnetic axes EA of the thin films 1 through 4. A flat conductive strip or a flat coil may serve, for example, as the conductor 9, and wherein the Wheatstone bridge 5 should be disposed in a region in which the conductor 9 generates as homogeneous an external magnetic field $H_a$ as possible, which magnetizes the thin films 1 through 4 in the direction of their hard magnetic axes HA.

The current $\frac{1}{2} I_o$ flowing in the thin film 2 generates in the thin film 1 an auxiliary magnetic field $+H_b$ directed, as seen in FIG. 2, leftward, so that the magnetizing vector M in the thin film 1 is rotated by a predetermined angle from the easy magnetic axis EA in a counter-clockwise direction. In an analagous manner there is generated in thin film 4 an auxiliary magnetic field $+H_b$ as a result of the current $\frac{1}{2} I_o$ flowing in the thin film 3, resulting in a rotation of the magnetizing vector M in a counterclockwise direction. The current $\frac{1}{2} I_o$ flowing in the thin film 1 or 4 generates in the thin film 2 or 3, respectively, an auxiliary magnetic field $-H_b$, and results in a rotation of the magnetized vector $-M$ in a clockwise direction. The resulting change of resistance is equal in all thin films 1 through 4, and the Wheatstone bridge 5 remains in equilibrium.

As soon as the Wheatstone bridge 5 is subjected to a magnetic external field $H_a$, then the electrical resistance in the different premagnetized thin films 1 through 4 changes in a different manner, and a bridge outward voltage $U_b$ results, which is a linear replica of the current $I_m$ to be measured.

Within a permissible control range, which is limited by respective thin films of the thin film pairs 1, 2, and 3, 4 being saturated.

$$U_b \approx \frac{2 \cdot \Delta R}{(1 + \gamma)^2 - \gamma_{12}^2} \cdot J_o \cdot h_b \cdot h_a \quad (1)$$

where $\Delta R$ Maximum resistance change of the thin films, $\gamma = \frac{N \cdot M_s}{H_k}$, A normalized demagnetization factor $\gamma_{12} = \frac{N_{12} \cdot M_s}{H_k}$, A normalized coupling factor, N Demagnetizing factor in the thin films,
$N_{12}$ The coupling factor of one thin film in a thin film pair with the other thin film,
$M_s$ The saturation magnetization,
$H_k$ The anisotrophic field strength, $$h_b = \frac{H_b}{H_k}, \text{ and } h_a = \frac{H_a}{H_k}$$

It will be understood that the magnitude of the current $I_o$ and the intensity of the auxiliary magnetic field $H_b$, which is dependent upon the magnitude of the current $I_o$ needs to be kept constant, but that an adjustment of the current $I_o$ is not necessary in order to achieve a linear dependence of the output voltage of the Wheatstone bridge 5 $U_b$ from the magnetic external field $H_a$.

Figure 3:
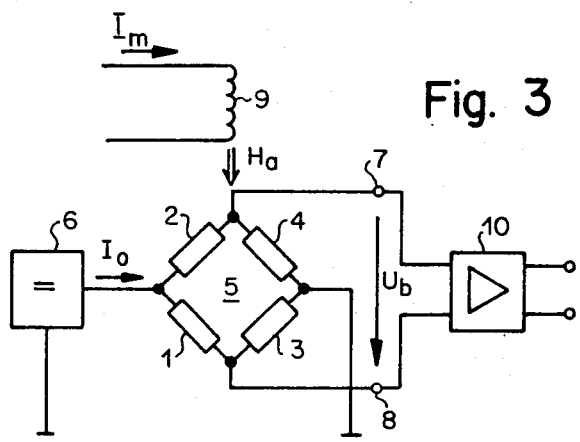
FIG. 3 is a schematic circuit of the current detector.

As can be seen from FIG. 3, a difference amplifier 10 is advantageously postcoupled to the Wheatstone bridge 5, which amplifier has a constant amplification factor and amplifies the bridge output voltage $U_b$ by a factor suitable to be measured or indicated. The difference amplifier 10 also isolates the output circuit thereof from the bridge circuit.

Figure 4:
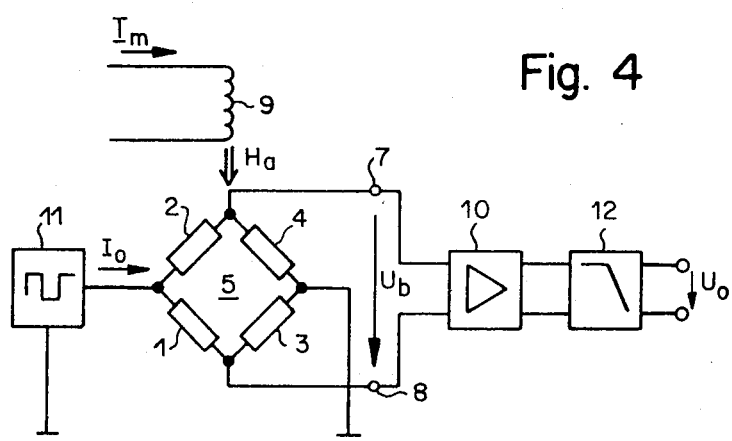
FIG. 4 is another version of the current detector.

So that any offset voltages of the Wheatstone bridge 5 can be suppressed, or at least minimized, as can be seen from FIG. 4, the Wheatstone bridge 5 is fed from an alternating current- or alternating voltage-source 11 which preferably generates a rectangular waveform. A low-pass filter 12 is postcoupled to the difference amplifier 10, which difference amplifier is connected to the output terminals 7 and 8 of the Wheatstone bridge 5. When the current $I_o$ changes its sign, the auxiliary magnetic fields $H_b$ also change their sign, so that, as can be seen from equation (1), the Wheatstone output voltage $U_b$ does not change its sign. At the output of the low-pass filter 12 there is obtained a voltage $U_o$, which is proportional to the external magnetic field $H_a$, and free of any offset errors of the Wheatstone bridge 5.

It is advantageous if two low-pass filters are employed in lieu of one low-pass filter 12; one such filter is then connected between the output terminal 7 of the Wheatstone bridge 5 and a first input of the difference amplifier 10, and the other filter is connected between the output terminal 8 of the Wheatstone bridge 5, and a second input of the difference amplifier 10. This has the advantage that the difference amplifier 10 need not process either the so-called common-mode voltage of the Wheatstone bridge 5, nor amplify any steep impulses of the output voltage of the Wheatstone bridge $U_b$ caused by any asymmetries of the bridge 5, so that the difference amplifier 10 need not have a wide pass band.

The Wheatstone bridge 5 is advantageously fed by an alternating current by providing switch means between the Wheatstone bridge 5 and a direct voltage- or direct current-source 13, which switch means alternately connect the plus terminal and the minus terminal of the voltage- or current-source 13 to the bridge 5. This ensures in a simple manner that the amplitude of the current $I_o$ is equal in each direction of flow.

Figure 5:
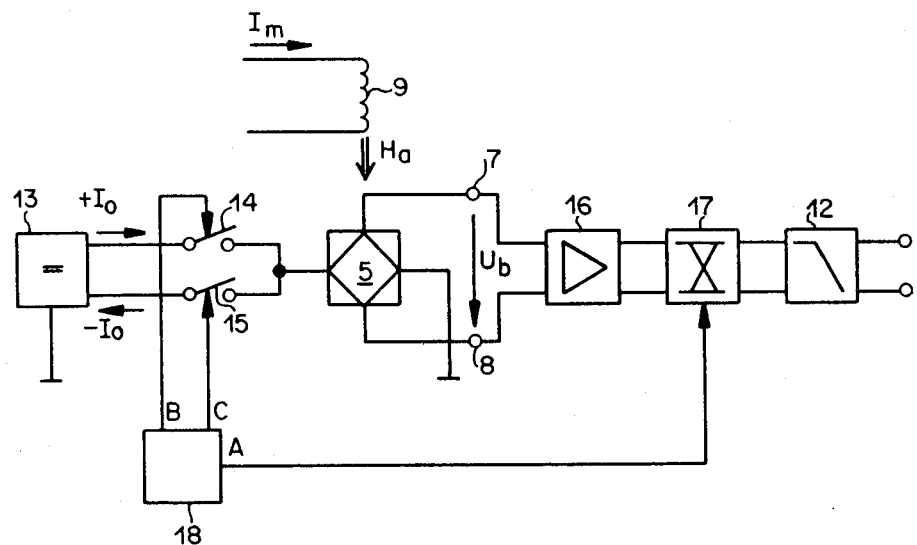
FIG. 5 is still another version of the current detector of the present invention.
Figure 6:
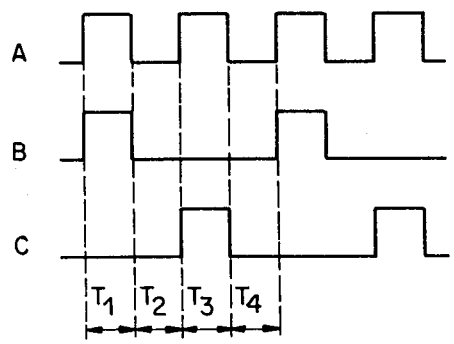
FIG. 6 are waveforms occurring in the circuit according to FIG. 5.

The block schematic circuit diagram of FIG. 5 shows how any offset errors of the difference amplifier 16 postcoupled to bridge 5 can be minimized. The direct voltage- or direct current source 13 feeds the Wheatstone bridge 5 through a switch 14 so as to result in a positive current $+I_o$, and via a switch 15 so as to result in a negative current $-I_o$. The amplifier receiving the output voltage of the Wheatstone bridge 5 appearing across terminals 7 and 8 is preferably an alternating current amplifier in the form of a difference amplifier 16, to which there is postcoupled a synchronous detector 17, and a low-pass filter 12. Time-controlled regulator means 18 furnishes the periodic signals A, B, and C, as shown in FIG. 6, required to control the synchronous detector 17 and the switches 14 and 15.

During a first time interval $T_1$ the switch 14 is closed, and the switch 15 is open. The Wheatstone bridge 5 is fed by the current $+I_o$, and a synchronous detector 17 passes the amplified bridge output voltage $U_b$, as well as any offset errors of the difference amplifier 16 to the filter 12, without inverting the output voltage $U_b$. During a second time interval $T_2$ both switches 14 and 15 are open, so that $U_b=0$; any offset voltage of the difference amplifier 16 is passed in its inverted form by the synchronous detector 17 to the filter 12. During a third time interval $T_3$, only the switch 15 is closed, and the amplified bridge output voltage $U_b$, as well as any offset voltage of the difference amplifier 16 are passed to the filter 12, without being inverted. During a fourth time interval $T_4$, both switches 14 and 15 are open and the inverted offset voltage of the difference amplifier 16 is passed to the filter 12.

The current $I_m$ is therefore measured during the time intervals $T_1$ and $T_3$. Any offset voltage of the difference amplifier 16 is not inverted during the time intervals $T_1$ and $T_3$, while it is inverted during the time intervals $T_2$ and $T_4$ and passed to the low-pass filter 12. As $T_1=T_2=T_3=T_4$, any of the voltages of the Wheatstone bridge 5 and the difference amplifier 16 are eliminated or at least minimized.

The aforedescribed current detector uses only four thin films 1 through 4, which are also used to generate the required auxiliary magnetic fields $H_b$, and is simple in construction. While separating galvanically the bridge circuit from the conductor 9, a linear replica of the current $I_m$ is obtained, and the current detector is suitable for measurement of alternating voltages or D.C. voltages and can be manufactured as a current detector free of any magnetic core as an integrated circuit. By connecting another conductor in parallel to the input of the current detector, provided it does not significantly affect the operation of the Wheatstone bridge 5, a current divider is formed for the current $I_m$ to be measured so that the range of the current detector can be selected within wide limits.

We wish it to be understood that we do not desire to be limited to the exact details of construction shown and described, for obvious modifications will occur to a person skilled in the art.

Having thus described the invention, what we claim as new and desire to be secured by Letters Patent is as follows:

1. In a magnetoresistive current detector, including a conductor carrying a current to be measured generating an external magnetic field,
   comprising in combination
   two pairs of ferromagnetic and magnetoresistive thin films having hard and easy axes, respectively, and being connected to one another so as to constitute a Wheatstone bridge, said Wheatstone bridge being adapted to be fed by a supply current from a current- or voltage-source,
   the thin films of each pair
      being magnetostatically coupled to one another, so that the portion of the supply current flowing in each thin film of each pair generates an auxiliary magnetic biasing field having a direction along the hard magnetic axis of the other thin film of the same pair,
   all of said films having substantially equal respective thicknesses, the thin films of each pair being superimposed to one another and separated by an insulating layer,
   said external magnetic field having a direction along the direction of the hard magnetic axes of each of said thin films.

2. A current detector as claimed in claim 1, wherein two thin films of different respective film pairs are disposed in a common plane.

3. A current detector as claimed in claim 1, further comprising a difference amplifier postcoupled to said Wheatstone bridge, thereby isolating the output of said difference amplifier from the output of said Wheatstone bridge.

4. A current detector as claimed in claim 3, wherein said source is an alternating current- or voltage-source, and further comprising a low-pass filter postcoupled to said difference amplifier, thereby removing any disturbing spikes from the output of said difference amplifier.

5. A current detector as claimed in claim 3, wherein said source is an alternating current- or voltage-source, and said difference amplifier has first and second inputs, and said Wheatstone bridge has first and second output terminals, and further comprising a first low pass filter connected between said first Wheatstone bridge output terminal and said first difference amplifier input, and a second low pass filter connected between said second Wheatstone bridge output terminal and said second difference amplifier input, whereby said difference amplifier can have a relatively narrow passband.

6. A current detector as claimed in claim 3, wherein said source is a bipolar source, having positive and negative terminals with respect to ground, and further comprising
   switch means connected between said source and one input terminal of said Wheatstone bridge, the other input terminal thereof being grounded,
   a synchronous detector postcoupled to said difference amplifier, and
   time-controlled regulator means connected between said switch means and said synchronous detector operable so as at least to minimize any bias or offset errors in said Wheatstone bridge and/or in said difference amplifier.

7. A current detector as claimed in claim 6, further comprising a low-pass filter postcoupled to said synchronous detector, thereby removing any disturbing spikes from the output of said difference amplifier.

* * * * *